United States Patent
Franz et al.

(10) Patent No.: US 6,528,779 B1
(45) Date of Patent: Mar. 4, 2003

(54) OPTOELECTRONIC MODULE

(75) Inventors: Heinz-Günther Franz, Hamburg (DE); Wolfgang Holzapfel, Obing (DE)

(73) Assignee: Dr. Johannes Heidenhein GmbH, Traunveut (DE)

(*) Notice: Subject to any disclaimer, the term of this patent is extended or adjusted under 35 U.S.C. 154(b) by 0 days.

(21) Appl. No.: 09/646,801
(22) PCT Filed: Mar. 22, 1999
(86) PCT No.: PCT/EP99/01919
§ 371 (c)(1), (2), (4) Date: Jan. 3, 2001
(87) PCT Pub. No.: WO99/49514
PCT Pub. Date: Sep. 30, 1999

(30) Foreign Application Priority Data

Mar. 25, 1998 (DE) .................. 298 05 392 U (51) Int. Cl.[7] .............................. G01D 5/34
(52) U.S. Cl. .............. 250/214.1; 250/231.13; 250/237 G; 257/98
(58) Field of Search ........... 250/214.1, 231.13–231.18, 250/237 G; 257/98

(56) References Cited

U.S. PATENT DOCUMENTS 5,638,469 A * 6/1997 Feldman et al. ............. 385/14
5,670,781 A * 9/1997 Setbacken ............. 250/231.16
6,097,857 A * 8/2000 Feldman ....................... 385/14

FOREIGN PATENT DOCUMENTS

| DE | 197 20 300 | 12/1997 |
| DE | 196 43 911 | 5/1998 |
| DE | 196 08 391 | 9/1998 |

OTHER PUBLICATIONS

Patent Abstracts of Japan, vol. 010, No. 046 (E–711), Feb. 2, 1989 regarding Japanese reference 63 240078 published Oct. 5, 1988.

Burgschat, Reiner, "Die neue Dimension in der Weg–und Einkelmesstechnik," F&M, vol. 104, No. 10, 1996, pp. 752–756.

* cited by examiner

Primary Examiner—Stephone Allen
(74) Attorney, Agent, or Firm—Brinks Hofer Gilson & Lione (57) ABSTRACT

An optoelectronic module including a transparent substrate that carries a conductor track, an optoelectronic chip having an optoelectronic sensor and/or emitter for light disposed on the substrate, and via a contacting element the chip is connected to the conductor track and kept spaced apart from the transparent substrate. An opaque light blocking element, disposed between the substrate and the chip, that shields the sensor from lateral incident light and/or lateral light opposite the emitter.

66 Claims, 5 Drawing Sheets

OPTOELECTRONIC MODULE

Applicants claim, under 35 U.S.C. §119, the benefit of priority of the filing date of Mar. 25, 1998 of a German patent application, copy attached, Ser. No. 298 05 392.6, filed on the aforementioned date, the entire contents of which is incorporated herein by reference.

BACKGROUND OF THE INVENTION

1. Field of the Invention

The invention relates to an optoelectronic module, which can be employed in particular in optoelectronic travel, angle and rotational measuring instruments or other optoelectronic devices.

2. Description of the Related Art

In the journal "F&M", No. 10 (1996), Vol. 104, pages 752–756, an emitter-receiver module is disclosed. An LED is disposed on a photodiode array chip, which is connected via gold bumps to conductor tracks on a transparent glass plate in what is known as flip-chip technology. The intermediate space between the chip and the glass substrate is filled with an underfiller for the sake of mechanical stabilization. This arrangement is intended to project light onto a scale by means of the LED and to detect the reflected light by the photodiodes. It is disadvantageous, however, that the underfiller is a very good light guide, which guides a large portion of the light in the underfiller, which has been projected by the LED, to the photodiodes. Portions of the light are diverted to the photodiodes by scattering in the underfiller and reflection at the boundary faces of the underfiller and the glass substrate, and further portions are projected directly at the edges of the LED onto the receiver surfaces of the optic chip. As a consequence, the proportion of useful light to parasitic or unwanted light striking the photodiodes is unfavorable.

From German Patent Disclosure DE 197 20 300 A, a chip-in-chip implantation of a gallium arsenide LED chip in a silicon-PIN-diode receiver matrix is known. Once again, there can be a considerable proportion of scattered light, which strikes the diode receiver matrix directly without taking the desired course, for instance to a scale having an optical graduation. As a result, on the one hand the useful signal proportion is reduced considerably, and on the other the photodiodes are already modulated with a considerable proportion of direct light. In such flip-chip assemblies, it is also conventional and for applications indispensable, for the sake of mechanical stability and surface passivation, that an optical underfiller be placed between the chip surfaces and the glass substrate plate. The underfiller does provide high mechanical strength and chemical resistance, but it causes an even larger proportion of light to be coupled directly to the photodiode surfaces. Once again, the optoelectronic efficiency is markedly worse as a result.

SUMMARY OF THE INVENTION

With this as the point of departure, an object and advantage of the present invention is to create an optoelectronic module in which the proportion of useful light to parasitic or unwanted light is improved.

The above object and advantage is attained by an optoelectronic module including a transparent substrate that carries a conductor track, an optoelectronic chip having an optoelectronic sensor and/or emitter for light disposed on the substrate and via a contacting element the chip is connected to the conductor track and kept spaced apart from the transparent substrate. An opaque light blocking element, disposed between the substrate and the chip, that shields the sensor from lateral incident light and/or lateral light opposite the emitter.

The optoelectronic module of the present invention has a transparent substrate that carries conductor tracks. This substrate may be in platelike form. Glass and/or plastic can be considered in particular as the material for the substrate.

An optoelectronic chip with at least one sensor and/or emitter for light is also present, which is disposed with the sensor and/or emitter oriented toward the substrate on the substrate. The sensor and/or emitter can be embodied in one face of the chip. However, it can also be an additional component that is mounted on the chip.

The chip is connected to the conductor tracks and kept at a distance from the transparent substrate via contacting elements. The contacting elements serve the purpose of both mechanical and electrical connection of the chip to the substrate or to the conductor tracks disposed on it. Gold bumps or similar contacting elements can be considered in particular as the contacting elements. The known flip-chip technology can be employed.

In the optoelectronic module, an underfiller is preferably disposed between the chip and the transparent substrate. The underfiller can be transparent, especially if it covers an optoelectronic sensor and/or emitter. The underfiller may involve an epoxy resin, silicone, or a similar hardening plastic material. An underfiller is indeed preferred but is not obligatory.

Finally, in the intermediate space between the chip and the transparent substrate, an opaque light blocking element is disposed, which more or less shields off the sensor from lateral incident light and/or lateral light projected by the emitter. Lateral denotes means an incidence of light or projection of light from or in a direction that is inclined to a vertical axis or line through the chip. This means, for instance, an incident light that does not originate directly at a specific external object but instead is due to scattering or reflection, or it can also be direct radiation from some other object. This parasitic or unwanted light can also originate in a light emitter integrated with the module. It can also be a light projection that is not aimed directly at a different object. As a consequence, in the module of the present invention, the proportion of parasitic or unwanted light striking the sensor or transmitted by the emitter is at least reduced considerably, and on the other hand, the proportion of useful light is increased.

The present invention also encompasses an only partial suppression of parasitic or unwanted light by the light blocking element. It is also within the scope of the present invention that the light blocking element is not ideally opaque, and the substrate and optionally the underfiller are not ideally transparent. Within the scope of the present invention, an opacity or transparency may exist with regard to only certain light wavelengths or light length ranges of a light source with which the optoelectronic module cooperates. The decisive factor is that a considerable suppression of parasitic or unwanted light in favor of the useful light is attained for at least a certain light wavelength.

The module may be purely a receiver module that cooperates with an external artificial or natural light source. In that case, the light blocking element especially suppresses the interfering influence of scattered and extraneous light. However, it can also be purely an emitter module that especially effectively transmits light to some external object. It can also be an emitter-receiver module, in which an emitter is disposed on the chip, and the light blocking element is disposed between the emitter and the sensor. The emitter can in particular be an LED. The light blocking element prevents both optical crosstalk from the emitter to the sensor and the incidence of extraneous light onto the sensor.

Especially if underfillers or some similar optically transparent potting compound is employed, the parasitic or unwanted light due to scattering and reflection is minimized in the module, and thermomechanical stresses in the overall structure can also be kept very low. Such stresses can be due in particular to the different coefficients of thermal expansion of the materials. To adapt the coefficients of expansion toward that of gold bumps, underfillers are often filled with finely ground quartz, but this in turn increases the proportion of scattered light. The present invention makes it easier to use such underfillers and ,thus, to reduce thermomechanical stresses.

The light blocking element is preferably of a conformable material that conforms to the chip and/or to the transparent substrate. This counteracts a passage of light between the light blocking element and the chip or substrate. For production reasons, however, the light blocking element can be solidly joined to the chip and/or the transparent substrate for this purpose. Thus, the light blocking element can include a commercially available silicone rubber or some other injection moldable material. For economic production, this material can already be applied to the wafer of the chip with a dispenser before the wafer is sawn apart. Another economical method uses a printable material, which is applied as a light blocking element by screen printing, for instance. In this way, light blocking elements can also be printed on in the wafer grouping. Naturally, it is also conceivable to apply the light blocking element to the transparent substrate and then to mount the chip.

The light blocking element is preferably elastically deformable. To that end, it can comprise silicone or some other elastically deformable material. It can be disposed, elastically prestressed, between the transparent substrate and the chip. The elastic light blocking element is capable of compensating for tolerances in the spacing between the transparent substrate and the optoelectronic chip that are due in particular to the technology of the connecting elements. In gold bumps, for instance, differences in spacing of approximately 20% are entirely normal. The elasticity assures a good lightproof contact with both the transparent substrate and the chip that prevents a passage of parasitic or unwanted light through them.

Precisely in the case of an elastic light blocking element, the bonding wires and/or leads needed can be passed between contacting faces of the light blocking element on the chip and/or on the transparent substrate. These bonding wires and/or conductor tracks can lead to an emitter and/or to a sensor. The bonding wires of an emitter can, however, also be passed through the light blocking element. The elastic light blocking element can also compensate for tolerances in the amount of underfiller employed, if the underfiller is positively displaced laterally in the bonding of the chip and the substrate.

The light blocking element can have various shapes. The suppression of parasitic or unwanted light is especially advantageous if the light blocking element surrounds the sensor and/or the emitter. In the case of an emitter-receiver module with a central light emitter and sensors distributed around it, for instance, the light blocking element can be disposed around the emitter. Especially in this case, it can be circular-annular in shape. It can also be embodied in matrix form in accordance with the disposition of a plurality of sensors on one chip and can surround a plurality of sensors.

The light blocking element can be; manufactured as a micromolded part. It can have specially designed channels that enable the underfiller to be introduced after the chip has been mounted on the substrate. Special laminations disposed in meandering fashion in the channels allow the underfiller to flow through, on the hand, and on the other they assure maximum lightproofness.

The inside face of the light blocking element can also be embodied such that it contributes to a better light yield from the light source. To that end, it can have a spherical, a spherical or planar form. As a result, an otherwise ineffective edge radiation from an LED can be utilized by targeted reflection from the inside face of the light blocking element.

The module can be used in particular in an optoelectronic instrument for measuring travel, angle or rotation. To that end, the emitter can be disposed either on the module or outside the module. The transparent substrate can then have a scanning grating for scanning of a scale.

The invention will be described in further detail below in terms of exemplary embodiments.

DESCRIPTION OF THE PREFERRED EMBODIMENT

Elements in the various exemplary embodiments that match one another are identified by the same reference numerals in the ensuing description. In this sense, the description has validity for all the exemplary embodiments involved. When the terms "top" and "bottom" are used, they pertain how the elements are disposed in the drawings.

Figure 1:
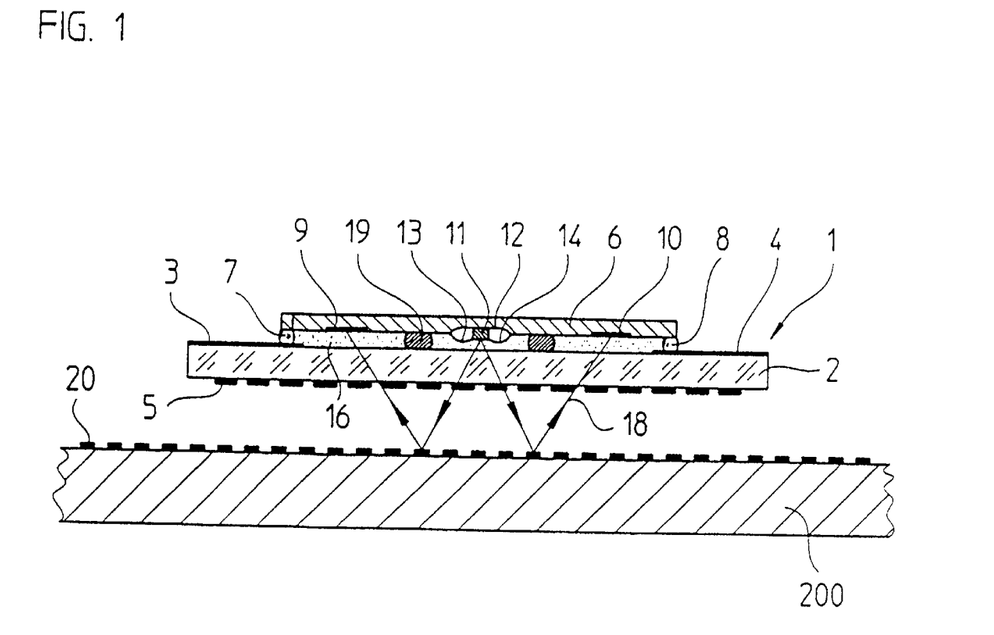
FIG. 1 is a schematic longitudinal section through a first embodiment of a emitter-receiver module and an optical position measuring instrument; according to the present invention FIG. 2, in an enlarged detail of FIG. 1, shows the development of the emitter-receiver module and optical position measuring instrument of, scattered light in the underfiller.

In FIG. 1, an emitter-receiver module 1 has a transparent substrate 2, which in this example is platelike and is of glass. On its surface, it has conductor tracks 3, 4. On the underside, it is provided with a matrix structure 5—also known as a scanning grating—including a succession of transparent and opaque regions each of constant length, which by way of example can be printed on or scratched in.

A chip 6 (semiconductor substrate) is disposed on the upper side of the substrate 2 and is fixed via gold bumps 7, 8 to the conductor tracks 3, 4 of the substrate 2 and electrically conductively joined to them. On the side toward the substrate 2, the chip 6 has a plurality of sensor surfaces 9, 10, which belong to integrated optoelectronic sensors.

Also on the side of the chip 6 toward the substrate 2, an optoelectronic emitter 11 is provided. It is located in the center of the chip 6 between the sensors 9, 10. In this example, it is a gallium arsenide light emitting diode 1 1 which is mounted in an indentation 12 in the underside of the chip and is contacted via bonding wires 13, 14 to conductor tracks on the underside of the chip 6.

Figure 2:
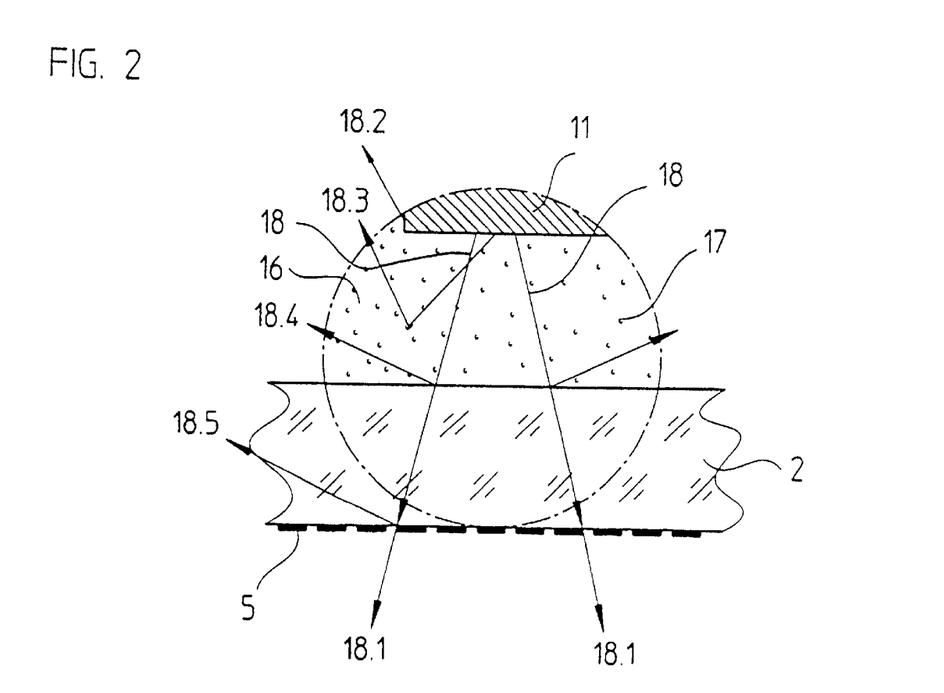

For passivation and to improve the mechanical stability, an underfiller 16 is disposed in this flip-chip structure in the intermediate space between the substrate 2 and the chip 6. The underfiller is transparent at least for the wavelength or wavelength range of the light transmitted by the emitter 11 and received by the sensors 9, 10. Such underfillers 16 as a rule include hardening plastic material, such as epoxy resin or silicone, which has a coefficient of thermal expansion that leads to strains in the emitter-receiver module 1. To adapt this coefficient of expansion to that of the gold bumps 7, 8, the underfiller 16 can be filled with quartz powder or quartz beads 17, as shown in FIG. 2. FIG. 2 also shows that of the light 18 projected by the LED 11, only a portion 18.1 (useful portion) directly passes through the transparent substrate 2 to reach the sensors 9, 10. Another portion is projected as edge radiation 18.2 directly from the side of the LED 11. A further portion 18.3 is reflected once or multiple times by the quartz particles 17. There are also portions 18.4 and 18.5 that are reflected from the surfaces of the substrate 2.

To keep the parasitic or unwanted light 18.2–18.5 in the underfiller 16 away from the sensor surfaces 9, 10, an annular, opaque light blocking element 19 is disposed between the chip 6 and the substrate 2 in FIG. 1. This light blocking element 19 can in particular include commercially available silicone rubber. For the sake of economical production, the light blocking element 19 can already be applied with a dispenser to a wafer that has not yet been sawn apart and that includes the chip 6. Another economical method for applying the light blocking element 19 that can be considered is screen printing. By it, light blocking elements 19 can also be printed on in the wafer grouping. It is also conceivable to apply the light blocking element 19 to the substrate 2 and then to put the chip 6 in place and fix it.

One advantage of an elastic light blocking element 19 is that it can compensate for tolerances in the height of the gold bumps 7, 8 and can have a good lightproof contact with the substrate 2 and the chip 6. It can also compensate for tolerances in the quantity of underfiller 16 inside and outside the light blocking element 19 that are caused by expansion. The bonding wires 13, 14 can also be passed through as needed, without having to provide special openings, since the material of the elastic light blocking element 19 is positively displaced at the locations where the bonding wires are.

Thus the light 18.1 emerging from the glass substrate 2 after passing through the matrix structure 5 preferentially reaches the sensors 9, 10. To that end, a scale 200 is associated with the underside of the emitter-receiver module 1; it has a surface, oriented parallel to the substrate 2, with a reflective matrix structure 20—also known as a measuring graduation. This structure or division can be applied or printed on or scratched in in a known manner by lithographic processes.

The light is reflected by the reflecting fields of the scale 200 and passes through the transparent regions of the scanning grating 5 of the substrate 2 to reach the sensors 9, 10. The light 18.1 is at best reflected weakly by the nonreflective fields of the scale 200, and these reflections are also kept away from the sensors 9, 10 by associated dark fields of the scanning grating 5 of the substrate 2. As a consequence, a very highly modulated light signal reaches the sensors 9, 10, and parasitic or unwanted light 18.2–18.5 from the emitter 11 is suppressed practically 15 entirely.

Figure 3:
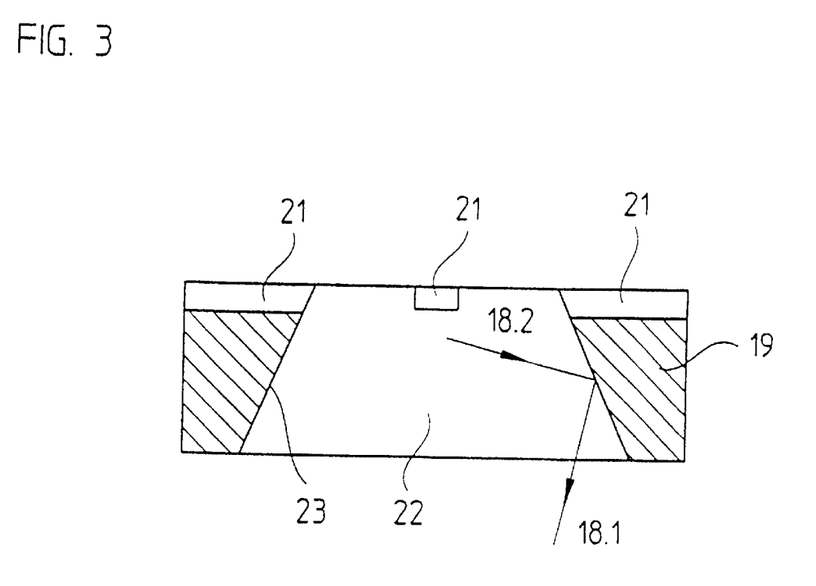
FIG. 3 is a schematic longitudinal section of a first embodiment of a light blocking element embodied as a molded part; according to the present invention

According to FIG. 3, a light blocking element 19 can be embodied as a micromolded part, in particular of elastic material. The element shown is embodied circular- cylindrically on its outer circumference. On the upper side, it has radially extending channels 21, through which an underfiller 16, even after assembly of the flip chip assembly, can be placed with the inclusion of this light blocking element 19 in the interior 22 thereof, and through which bonding wires 13 can also be passed as needed. The channels 21 can have meandering laminations—not shown in the drawing—that enable the underfiller 16 to flow through but assure maximal lightproofness. The interior 22 can have a specially designed inner surface 23 which is conically shaped in the region. It can contribute to the light yield of the emitter 11 by reflecting the otherwise ineffective edge radiation 18.2 or also scattered radiation 18.3 inside the underfiller 16 in the direction of the desired light radiation 18.1.

Figure 4:
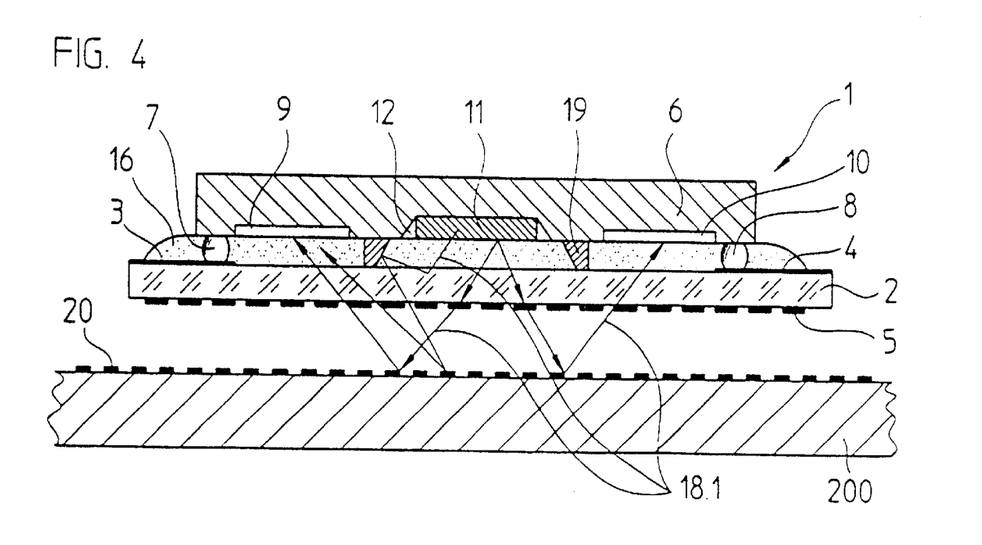
FIG. 4 is a schematic longitudinal section through a second embodiment of a emitter-receiver module with the light blocking element of FIG. 3 and a depth-structured chip; according to the present invention

In FIG. 4, a similar arrangement to FIG. 1 is shown, but its module 1 has a light blocking element 19 as in FIG. 3. A light emitting diode 11 is also sunk into the indentation 12 of the chip 6 in such a way that as a result the sensors 9, 10 are already shielded from its edge radiation 18.2. Thus, it is above all the scattered light components 18.3–18.5 that are shielded off by the light guard barrier 19. The bonding wires—not shown—needed for the electrical connection of the LED 11 can be passed between the light blocking element 19 and the substrate 2. Because of the elasticity of the light blocking element 19, the bonding wires are pressed in lightproof and sealing fashion against the substrate 2 or the chip 6.

Figure 5:
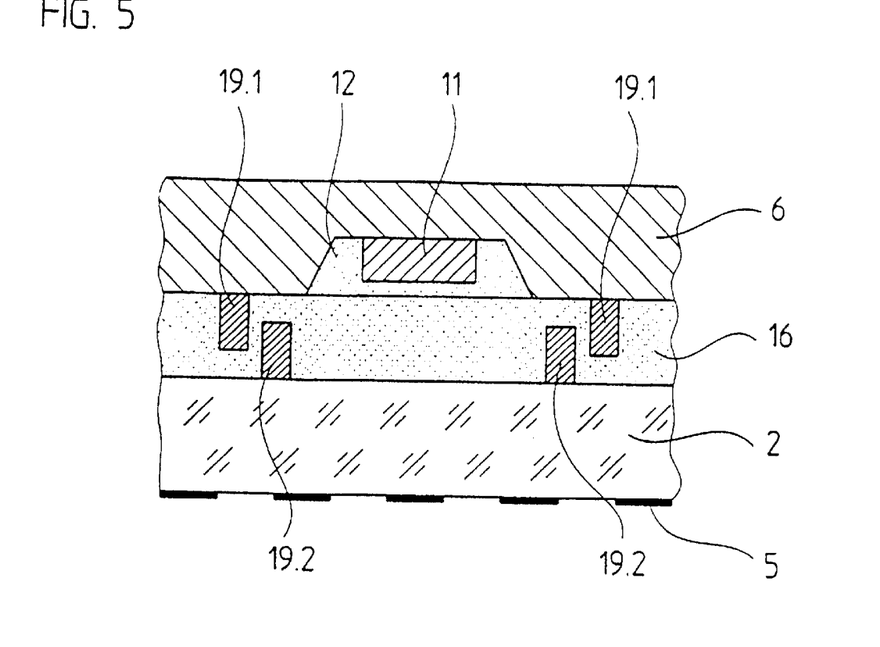
FIG. 5 is a detail of a third embodiment of a emitter-receiver module with a further light blocking element; according to the present invention

In FIG. 5, another embodiment of a light blocking element 19 is shown. It includes mutually offset annular ribs 19.1 and 19.2. One of the ribs 19.1 is applied as an annular shutter on the chip 6, and the other rib 19.2, of somewhat lesser diameter, is applied to the transparent substrate. The height of each of the ribs 19.1 and 19.2 is somewhat less than the spacing between the chip 6 and the substrate 2. The ribs 19.1, 19.2 guarantee extensive lightproofness for the radiation 18.2–18.5, but allow the underfiller 16 to flow through and also as needed allow the bonding wires 13, 14 to be passed through the gap between the ribs 19.1 and 19.2. This arrangement has the advantage that the light blocking element 19 can be manufactured with greater tolerance in terms of height, yet nevertheless secure light sealing and forceless bridging of the spacing are achieved.

Figure 6:
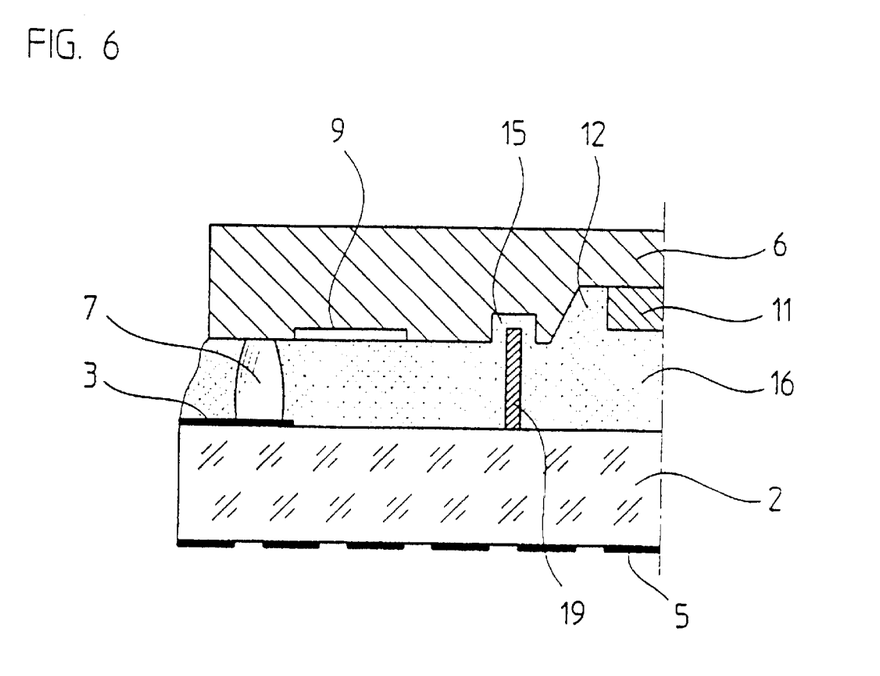
FIG. 6 is a detail of a fourth embodiment of a module according to the present invention.

To enable manufacturing the light blocking element 19 with high tolerance in terms of height, it can alternatively include a single rib 19, which penetrates an indentation 15 in the chip 6 and/or substrate 2, as shown in FIG. 6.

Figure 7:
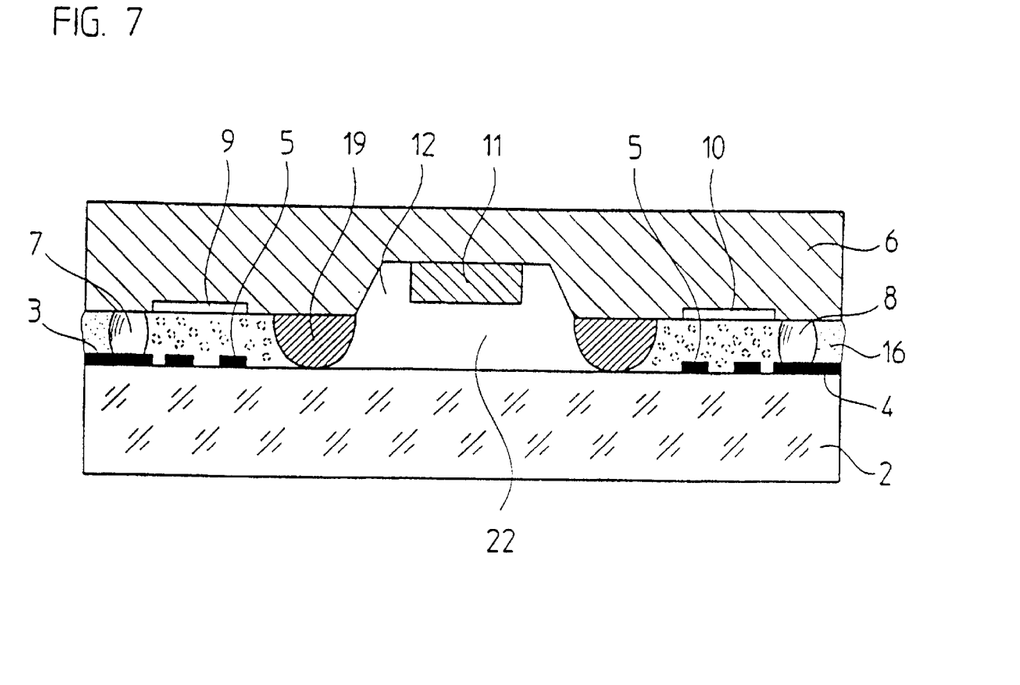
FIG. 7 is a detail of a fifth embodiment of a module according to the present invention.

The light blocking element 19 can also perform the function of stopping the flow of underfiller 16. Then the underfiller 16 can be disposed on only one side of the light blocking element 19. It is advantageous to keep the space 22 around the emitter 11 free of underfiller 16. This has the advantage that no mechanical strains act on the emitter 11, and that the interfering radiation 18.3 is eliminated. One example of this is shown in FIG. 7.

Figure 8:
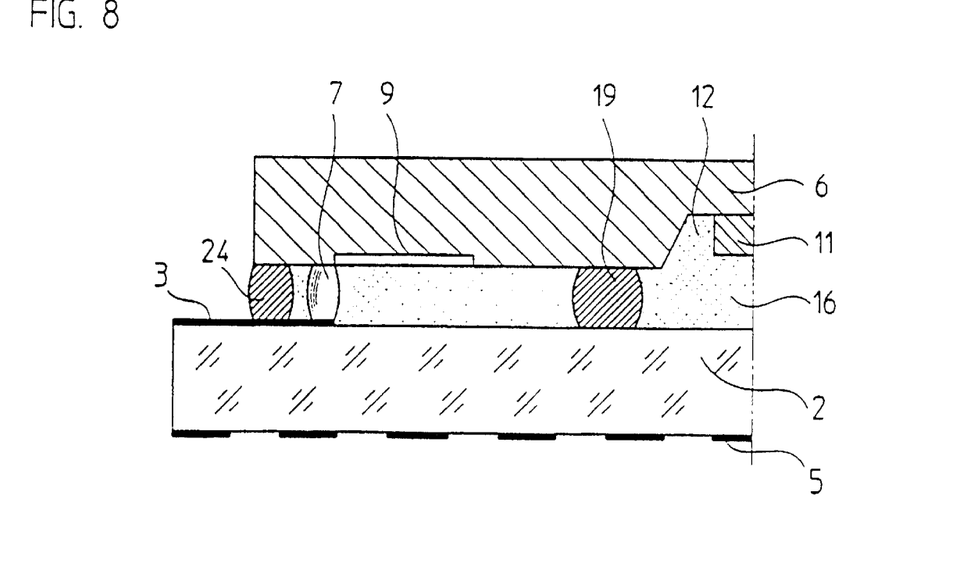
FIG. 8 is a detail of a sixth embodiment of a module according to the present invention.
Figure 9:
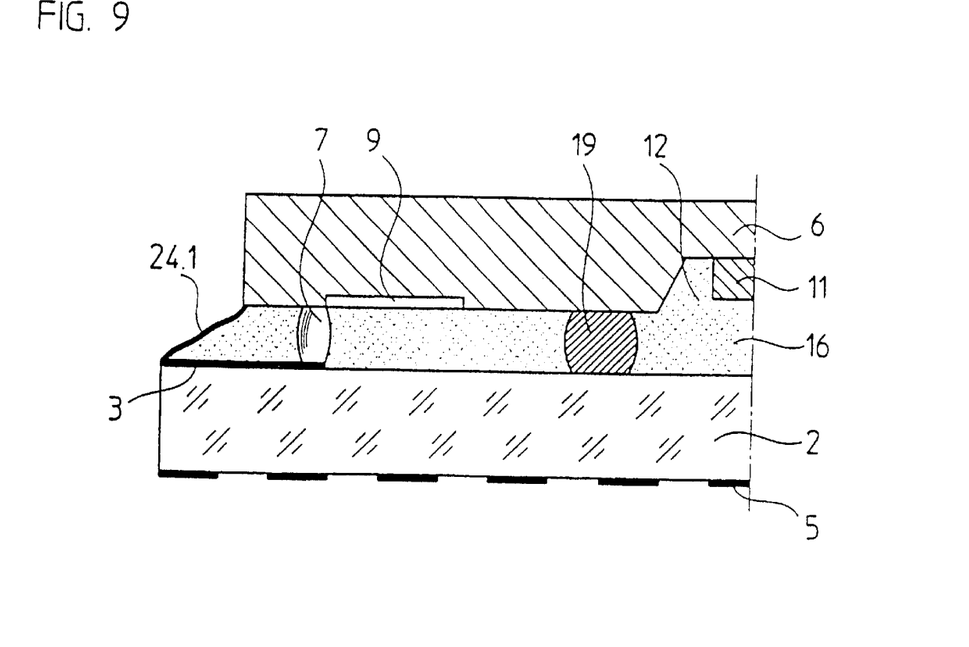
FIG. 9 is a detail of a seventh embodiment of a module according to the present invention.

To avoid introducing of extraneous light laterally onto the sensors 9, 10, an additional light blocking element 24 or 24.1 can be disposed in the outer region of the chip 6 next to the gold bumps 7, 8. This light blocking element also reduces the influence of extraneous light that is reflected from the scale 200. As a consequence, these versions have a further improved ratio of useful light to parasitic or unwanted light. In FIG. 8, this additional light blocking element is an elastic seal 24 in the form of an annular shutter and in FIG. 9 it is an encompassing opaque coating 24.1 of the underfiller 16.

Figure 10:
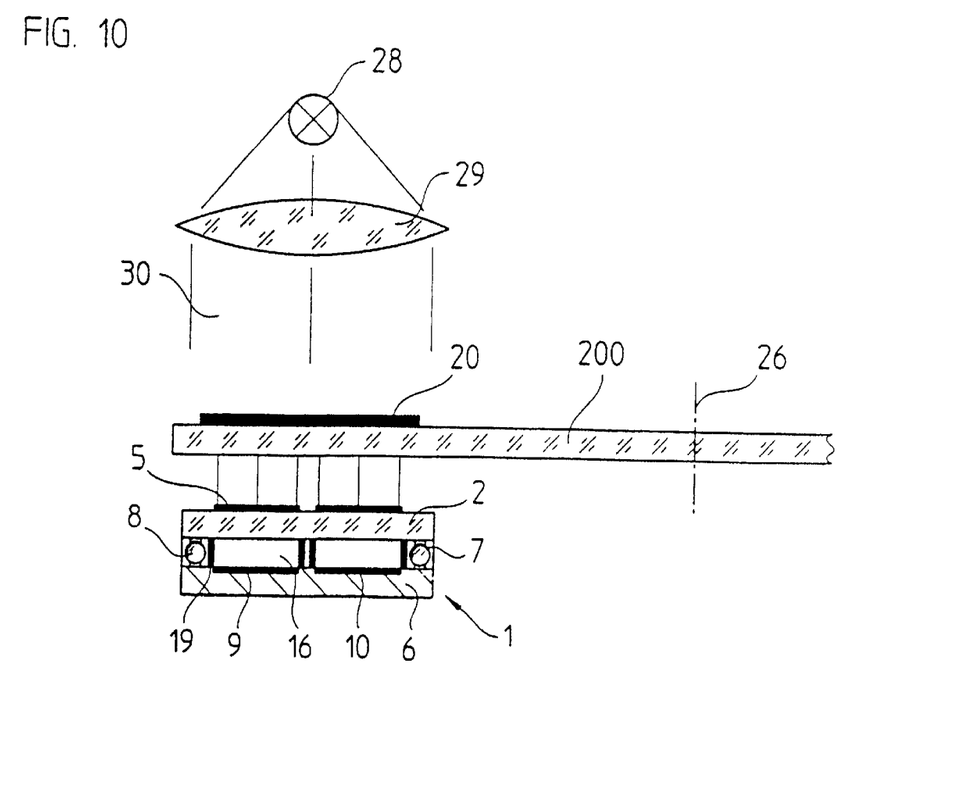
FIG. 10 is a schematic longitudinal section through an eighth embodiment of a module according to the present invention; in an angle measuring instrument operating by the transmitted light principle according to the present invention.

FIG. 10 shows a transmitted light arrangement, in which the module 1 is purely a receiver module. Once again it has a platelike transparent substrate 2, which is joined to a chip 6 via gold bumps 7, 8. The chip 6 has a photodiode array 9, 9', 10, (9, 10' not shown) with light-sensitive surfaces, which are surrounded by a matrixlike light blocking element 19. For economical production, the matrixlike light blocking element 19 can be printed on using a screen printing template.

Between the substrate 2 and the chip 6, an underfiller 16 is located inside the openings of the light blocking element 19.

In FIG. 10, a scale in the form of a code disk 200 is associated with the module 1 on the side of the substrate 2; this disk is rotatable about an axis 26. In a region through which light can be projected, the disk has a matrix structure 20 of bright and dark fields through which light can be transmitted. On the top of the substrate 2, a corresponding matrix structure 5—shown only schematically, with four 90° phase-shifted scanning gratings, one of which is assigned to each of the sensors 9, 9', 10, 10', is associated with the matrix structure 20.

A light emitting diode 28 is disposed above the code disk 200, and a condenser 29 is disposed between them.

The light emitting diode 28 and the condenser 29 generate a parallel beam of light 30, which shines through the matrix structure 20 of the code disk 200. This rotary—position-dependent pattern of light then strikes the four 90° phase-shifted scanning gratings 5 of the substrate 2. As a consequence, four sinusoidally modulated streams of light are created, of each of which a portion again strikes a sensor 9, 9', 10, 10' of the four-field diode array on the chip 6, which generates corresponding position-dependent electrical signals. Optical crosstalk between the various light signals is prevented by the matrixlike light blocking element 19.

In a manner not shown, the light blocking element can also be formed by the contacting elements 7, 8, by lining up individual gold bumps next to each other, or by placing a solder wire on one face of the substrate 2 and/or chip 6. In these embodiments, the light blocking element has a dual function, namely light shielding and electrical contacting.

The invention may be embodied in other forms than those specifically disclosed herein without departing from its spirit or essential characteristics. The described embodiments are to be considered in all respects only as illustrative and not restrictive, and the scope of the invention is commensurate with the appended claims rather than the foregoing description.

We claim:

1. An optoelectronic module, comprising:
   a transparent substrate that carries a conductor track;
   an optoelectronic chip comprising a optoelectronic sensor disposed on said substrate, and via a contacting element said chip is connected to said conductor track and kept spaced apart from said transparent substrate; and
   an opaque light blocking element, disposed between said substrate and said chip, that shields said sensor from lateral incident light.

2. The optoelectronic module of claim 1, wherein said light blocking element comprises an elastic conformable material, which conforms to said chip and adapts to the spacing between said chip and said substrate.

3. The optoelectronic module of claim 1, wherein said light blocking element comprises an elastic conformable material, which conforms to said transparent substrate and adapts to the spacing between said chip and said substrate.

4. The optoelectronic module of claim 1, wherein said light blocking element is solidly joined to said chip.

5. The optoelectronic module of claim 1, wherein said light blocking element is solidly joined to said transparent substrate.

6. The optoelectronic module of claim 1, wherein said light blocking element comprises injection-moldable which is applied to said chip.

7. The optoelectronic module of claim 1, wherein said light blocking element comprises injection-moldable which is applied to said substrate.

8. The optoelectronic module of claim 1, wherein said light blocking element comprises printable material which is applied to said chip.

9. The optoelectronic module of claim 1, wherein said light blocking element comprises printable material which is applied to said substrate.

10. The optoelectronic module of claim 1, further comprising an emitter for light.

11. The optoelectronic module of claim 10, wherein said sensor and said emitter are disposed on or in said chip, and said light blocking element is disposed between said sensor and said emitter.

12. The optoelectronic module of claim 11, wherein said sensor and a second sensor are distributed about said emitter.

13. The optoelectronic module of claim 1, wherein said light blocking element surrounds said sensor.

14. The optoelectronic module of claim 13, wherein said light blocking element is embodied in circular-annular form.

15. The optoelectronic module of claim 1, wherein a bonding wire of said sensor is passed through said light blocking element.

16. The optoelectronic module of claim 1, further comprising an underfiller that is disposed in an intermediate space between said chip and said transparent substrate.

17. The optoelectronic module of claim 16, wherein said underfiller is disposed on only one side of said light blocking element.

18. The optoelectronic module of claim 1, wherein said light blocking element comprises a first rib of said chip and a second rib of said substrate, wherein said first and second ribs are disposed offset from one another and overlap in height.

19. The optoelectronic module of claim 1, wherein said light blocking element comprises only one rib, and said rib engages an indentation of said substrate.

20. The optoelectronic module of claim 1, wherein said light blocking element comprises only one rib, and said rib engages an indentation of said chip.

21. The optoelectronic module of claim 1, wherein said transparent substrate comprises a plurality of opaque and transparent regions disposed in alternation, which form a scanning grating for cooperation with a measurement graduation of a scale of a position measuring system.

22. An optoelectronic module, comprising:
a transparent substrate that carries a conductor track;
an optoelectronic chip comprising a sensor and an emitter for light disposed on said substrate, and via a contacting element said chip is connected to said conductor track and kept spaced apart from said transparent substrate; and
an opaque light blocking element, disposed between said substrate and said chip, that shields said sensor from lateral light opposite the emitter.

23. The optoelectronic module of claim 22, wherein said light blocking element comprises an elastic conformable material, which conforms to said chip and adapts to the spacing between said chip and said substrate.

24. The optoelectronic module of claim 22, wherein said light blocking element comprises an elastic conformable material, which conforms to said transparent substrate and adapts to the spacing between said chip and said substrate.

25. The optoelectronic module of claim 22, wherein said light blocking element is solidly joined to said chip.

26. The optoelectronic module of claim 22, wherein said light blocking element is solidly joined to said transparent substrate.

27. The optoelectronic module of claim 22, wherein said light blocking element comprises injection-moldable which is applied to said chip.

28. The optoelectronic module of claim 22, wherein said light blocking element comprises injection-moldable which is applied to said substrate.

29. The optoelectronic module of claim 22, wherein said light blocking element comprises printable material which is applied to said chip.

30. The optoelectronic module of claim 22, wherein said light blocking element comprises print able material which is applied to said substrate.

31. The optoelectronic module of claim 22, wherein said sensor and said emitter are disposed on or in said chip, and said light blocking element is disposed between said sensor and said emitter.

32. The optoelectronic module of claim 22, wherein said sensor and a second sensor are distributed about said emitter.

33. The optoelectronic module of claim 22, wherein said light blocking element surrounds said emitter.

34. The optoelectronic module of claim 33, wherein said light blocking element is embodied in circular-annular form.

35. The optoelectronic module of claim 22, wherein a bonding wire of said emitter is passed through said light blocking element.

36. The optoelectronic module of claim 22, further comprising an underfiller that is disposed in an intermediate space between said chip and said transparent substrate.

37. The optoelectronic module of claim 36, wherein said underfiller is disposed on only one side of said light blocking element.

38. The optoelectronic module of claim 37, wherein a space, blocked off by said light blocking element, around said emitter is free of underfiller.

39. The optoelectronic module of claim 22, wherein said light blocking element comprises a first rib of said chip and a second rib of said substrate, wherein said first and second ribs are disposed offset from one another and overlap in height.

40. The optoelectronic module of claim 22, wherein said light blocking element comprises only one rib, and said rib engages an indentation of said substrate.

41. The optoelectronic module of claim 22, wherein said light blocking element comprises only one rib, and said rib engages an indentation of said chip.

42. The optoelectronic module of claim 22, wherein said transparent substrate comprises a plurality of opaque and transparent regions disposed in alternation, which form a scanning grating for cooperation with a measurement graduation of a scale of a position measuring system.

43. A position measuring system comprising;
a scale comprising a measurement graduation; and
an optoelectronic module, comprising:
a transparent substrate that carries a conductor track;
an optoelectronic chip comprising an optoelectronic sensor disposed on said substrate, and via a contacting element said chip is connected to said conductor track and kept spaced apart from said transparent substrate; and
an opaque light blocking element, disposed between said substrate and said chip, that shields said sensor from lateral incident light.

44. The position measuring system of claim 43, wherein said light blocking element comprises an elastic conformable material, which conforms to said chip and adapts to the spacing between said chip and said substrate.

45. The position measuring system of claim 43, wherein said light blocking element comprises printable material which is applied to said chip.

46. The position measuring system of claim 43, further comprising an emitter for light.

47. The position measuring system of claim 46, wherein said sensor and said emitter are disposed on or in said chip, and said light blocking element is disposed between said sensor and said emitter.

48. The position measuring system of claim 43, wherein said light blocking element surrounds said sensor.

49. The position measuring system of claim 48, wherein said light blocking element is embodied in circular-annular form.

50. The position measuring system of claim 43, further comprising an underfiller that is disposed in an intermediate space between said chip and said transparent substrate.

51. The position measuring system of claim 50, wherein said underfiller is disposed on only one side of said light blocking element.

52. The position measuring system of claim 43, wherein said light blocking element comprises a first rib of said chip and a second rib of said substrate, wherein said first and second ribs are disposed offset from one another and overlap in height.

53. The position measuring system of claim 43, wherein said light blocking element comprises only one rib.

54. The position measuring system of claim 43, wherein said transparent substrate comprises a plurality of opaque and transparent regions disposed in alternation, which form a scanning grating.

55. A position measuring system, comprising:
a scale comprising a measurement graduation; and
an optoelectronic module, comprising:
a transparent substrate that carries a conductor track;
an optoelectronic chip comprising a sensor and an emitter for light disposed on said substrate, and via a contacting element said chip is connected to said conductor track and kept spaced apart from said transparent substrate; and
an opaque light blocking element, disposed between said substrate and said chip, that shields said sensor from lateral light opposite said emitter.

56. The position measuring system of claim 55, wherein said light blocking element comprises an elastic conformable material, which conforms to said chip and adapts to the spacing between said chip and said substrate.

57. The position measuring system of claim 55, wherein said light blocking element comprises printable material which is applied to said chip.

58. The position measuring system of claim 55, wherein said sensor and said emitter are disposed on or in said chip, and said light blocking element is disposed between said sensor and said emitter.

59. The position measuring system of claim 55, wherein said light blocking element surrounds said emitter.

60. The position measuring system of claim 59, wherein said light blocking element is embodied in circular-annular form.

61. The position measuring system of claim 55, further comprising an underfiller that is disposed in an intermediate space between said chip and said transparent substrate.

62. The position measuring system of claim 61, wherein said underfiller is disposed on only one side of said light blocking element.

63. The position measuring system of claim 62, wherein a space, blocked off by said light blocking element, around said emitter is free of underfiller.

64. The position measuring system of claim 55, wherein said light blocking element comprises a first rib of said chip and a second rib of said substrate, wherein said first and second ribs are disposed offset from one another and overlap in height.

65. The position measuring system of claim 55, wherein said light blocking element comprises only one rib.

66. The position measuring system of claim 55, wherein said transparent substrate comprises a plurality of opaque and transparent regions disposed in alternation, which form a scanning grating.

* * * * *

UNITED STATES PATENT AND TRADEMARK OFFICE
CERTIFICATE OF CORRECTION

PATENT NO. : 6,528,779 B1
DATED : March 4, 2003
INVENTOR(S) : Heinz-Günther Franz et al.

It is certified that error appears in the above-identified patent and that said Letters Patent is hereby corrected as shown below:

<u>Column 9,</u>
Line 39, delete "print able" and substitute -- printable -- in its place.

Signed and Sealed this

Twenty-second Day of July, 2003

JAMES E. ROGAN
*Director of the United States Patent and Trademark Office*